(12) United States Patent
Kim et al.

(10) Patent No.: US 9,570,383 B2
(45) Date of Patent: Feb. 14, 2017

(54) SEMICONDUCTOR PACKAGE, MODULE SUBSTRATE AND SEMICONDUCTOR PACKAGE MODULE HAVING THE SAME

(71) Applicants: Jin-Kyung Kim, Hwaseong-si (KR); Yong-hoon Kim, Suwon-si (KR); Seong-Ho Shin, Hwaseong-si (KR)

(72) Inventors: Jin-Kyung Kim, Hwaseong-si (KR); Yong-hoon Kim, Suwon-si (KR); Seong-Ho Shin, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/746,247

(22) Filed: Jun. 22, 2015

(65) Prior Publication Data

US 2016/0172286 A1    Jun. 16, 2016

(30) Foreign Application Priority Data

Dec. 12, 2014    (KR) .......................... 10-2014-0179185

(51) Int. Cl.
*H01L 23/02*    (2006.01)
*H01L 23/498*    (2006.01)
*H05K 1/18*    (2006.01)
*H01L 23/31*    (2006.01)

(52) U.S. Cl.
CPC ... *H01L 23/49816* (2013.01); *H01L 23/49838* (2013.01); *H05K 1/181* (2013.01); *H01L 23/3128* (2013.01); *H01L 2224/32225* (2013.01); *H01L 2224/48227* (2013.01); *H01L 2224/73265* (2013.01); *H01L 2924/0002* (2013.01); *H01L 2924/15311* (2013.01); *H01L 2924/181* (2013.01); *H05K 2201/09218* (2013.01); *H05K 2201/10378* (2013.01); *H05K 2201/10734* (2013.01)

(58) Field of Classification Search
CPC .................... H01L 23/49186; H01L 23/49838; H05K 1/181; H05K 2201/09218; H05K 2201/10378; H05K 2201/10734
USPC .......... 257/678, 786, 691, 737, 499; 29/852; 361/768; 716/113
See application file for complete search history.

(56) References Cited

U.S. PATENT DOCUMENTS

| 6,235,997 | B1 | 5/2001 | Asada et al. |
| 6,265,783 | B1* | 7/2001 | Juso ..................... H01L 23/3128 |
| | | | 257/738 |
| 7,242,093 | B2* | 7/2007 | Ueda ....................... H01L 22/32 |
| | | | 257/737 |

(Continued)

FOREIGN PATENT DOCUMENTS

| JP | 4025767 B2 | 12/2007 |
| JP | 2008-182062 A | 8/2008 |

(Continued)

*Primary Examiner* — Mohammed Shamsuzzaman
(74) *Attorney, Agent, or Firm* — Harness, Dickey & Pierce, P.L.C.

(57) ABSTRACT

Semiconductor packages, module substrates and semiconductor package modules having the same are provided. The semiconductor package module includes a module substrate provided with a plurality of signal wires on an upper surface thereof, a package substrate disposed on the module substrate, a semiconductor chip disposed on one surface of the package substrate, and a plurality of external connection terminals disposed on another surface of the package substrate.

8 Claims, 10 Drawing Sheets

(56) References Cited

U.S. PATENT DOCUMENTS

| | | | |
|---|---|---|---|
| 7,277,298 B2 | 10/2007 | Ohsaka | |
| 7,391,122 B1 * | 6/2008 | Hool | B65D 21/041 |
| | | | 257/723 |
| 7,611,981 B1 | 11/2009 | Stearns et al. | |
| 8,129,837 B2 * | 3/2012 | Pendse | H01L 23/49838 |
| | | | 257/691 |
| 8,456,025 B2 * | 6/2013 | Yokoyama | H01L 24/06 |
| | | | 257/786 |
| 8,742,565 B2 | 6/2014 | Weekly et al. | |
| 8,759,941 B2 * | 6/2014 | Yokoyama | H01L 24/06 |
| | | | 257/203 |
| 8,803,329 B2 | 8/2014 | Aoki | |
| 2003/0227093 A1 * | 12/2003 | Hsu | H01L 23/49838 |
| | | | 257/778 |
| 2004/0016117 A1 * | 1/2004 | Wyrzykowska | H05K 1/115 |
| | | | 29/852 |
| 2009/0193374 A1 * | 7/2009 | Fujimoto | G06F 17/5031 |
| | | | 716/113 |
| 2011/0084395 A1 | 4/2011 | Takeda et al. | |
| 2013/0107484 A1 * | 5/2013 | Sakuma | H01L 23/49816 |
| | | | 361/768 |

FOREIGN PATENT DOCUMENTS

| | | |
|---|---|---|
| JP | 2009-004628 A | 1/2009 |
| KR | 0517608 A | 4/2006 |

\* cited by examiner

SEMICONDUCTOR PACKAGE, MODULE SUBSTRATE AND SEMICONDUCTOR PACKAGE MODULE HAVING THE SAME

CROSS-REFERENCE TO RELATED APPLICATION

This application claims priority under 35 U.S.C. §119 to Korean Patent Application No. 10-2014-0179185 filed on Dec. 12, 2014, the disclosure of which is hereby incorporated by reference in its entirety.

BACKGROUND

1. Technical Field

The present disclosure generally relates to semiconductor packages, module substrates and semiconductor package modules having the same. More particularly, the present disclosure relates to a ball grid array semiconductor package, a module substrate and a semiconductor package module having the same.

2. Description of the Related Art

In accordance with the trend of lightness, thinness, shortness, and smallness of electronic devices, high-density and large-scale integration of packages that are core elements of the electronic devices has been emphasized. A ball grid array (BGA) package is a representative example of packages developed to achieve the above purpose. Compared to typical plastic packages, BGA packages can reduce an area required to mount module substrates and have superior electrical characteristics.

BGA packages use printed circuit boards (PCBs) instead of lead frames, unlike the typical plastic packages. The PCBs can provide an entire area of a surface opposite to a surface on which a semiconductor ship is mounted as an area for disposition of solder balls that are external connection terminals, thus making it possible to increase the mounting density of module substrates.

However, as high-density and large-scale integration of semiconductor packages is required, there is a need for fine design in a wiring pattern, etc. to produce module substrates meeting the above requirement, thus increasing a production cost.

SUMMARY

At least one embodiment of the present disclosure provides a semiconductor package that includes a semiconductor package substrate capable of enhancing the degree of freedom in design of a wiring pattern of a module substrate.

At least one embodiment provides a semiconductor package module that includes a module substrate which does not require a separate fine process, thus reducing the production cost.

At least one embodiment provides a semiconductor package that can enhance an efficiency in the use of space with regard to an external terminal for input or output of external signals, and provides a semiconductor package module having the same.

The present disclosure is not limited to the above-mentioned example embodiments, and those skilled in this art will be able to easily understand other unmentioned embodiments from the following description.

According to one embodiment, there is provided a semiconductor package module comprising a module substrate provided with a plurality of signal wires on an upper surface thereof, a package substrate disposed on the module substrate, a semiconductor chip disposed on a first surface of the package substrate, and a plurality of external connection terminals disposed on a second surface of the package substrate. The external connection terminals are electrically connected to the semiconductor chip. The second surface of the package substrate which is an opposite surface of the first surface of the package substrate includes a plurality of terminal disposition portions and a plurality of non-terminal portions. The external connection terminals are respectively disposed in the terminal disposition portions and respectively connected to the signal wires so that high-speed signals are input or output through the external connection terminals. The non-terminal portions are disposed adjacent to an edge of the package substrate at positions spaced apart from each other at regular intervals. Some of the terminal disposition portions are disposed between the non-terminal portions, and at least two of the signal wires pass through each of the non-terminal portions.

According to one embodiment, there is provided a semiconductor package comprising a package substrate including a first surface and a second surface opposite to the first surface, a semiconductor chip mounted on the first surface of the package substrate, a plurality of external connection terminals disposed on the second surface of the package substrate and electrically connected to the semiconductor chip. The semiconductor chip includes a signal controller. The external connection terminals form a regular array. At least four pairs of the external connection terminals disposed on three columns of the array that are adjacent to an edge of the package substrate and are configured to receive differential signals and to input the differential signals to the signal controller. The signal controller of the semiconductor chip is configured to process the input differential signals.

According to one embodiment, there is provided a semiconductor package comprising a package substrate including a first surface and a second surface opposite to the first surface, a semiconductor chip mounted on the first surface of the package substrate, a plurality of external connection terminals disposed on the second surface of the package substrate. The external connection terminals are electrically connected to the semiconductor chip. The external connection terminals include first and second external connection terminal groups disposed adjacent to an edge of the package substrate. Each of the first and second external connection terminal groups comprises first through eighth external connection terminals. The first and second external connection terminals are arranged on a first row, the third through fifth external connection terminals are arranged on a second row, and the sixth through eighth external connection terminals are arranged on a third row. The third and sixth external connection terminals are arranged on a first column, the first, fourth and seventh external connection terminals are arranged on a second column, and the second, fifth and eighth external connection terminals are arranged on a third column.

According to one embodiment, there is provided a module substrate comprising a substrate, and a plurality of signal wires formed on a surface of the substrate. The signal wires comprise first and second signal wire groups extending from an edge of the substrate toward an inner side of the substrate. Each of the signal wire groups comprises first through eighth signal wires, and the surface of the substrate includes first through third areas successively arranged in a direction from the edge of the substrate toward the inner side of the substrate. The first and second signal wires extends to the first area, the third through fifth signal wires extend to the second area, and the sixth through eighth signal wires extend to the third area. The first through eight signal wires are parallel to each other in an area defined between the edge of the substrate and the first area.

BRIEF DESCRIPTION OF THE DRAWINGS

The above and other objects, features and advantages of the present disclosure will be more clearly understood from the following detailed description taken in conjunction with the accompanying drawings, in which.

DETAILED DESCRIPTION OF THE EMBODIMENTS

Advantages and features of the present disclosure and methods of accomplishing the same may be understood more readily by reference to the following detailed description of example embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concepts of the present disclosure to those skilled in the art, and the present disclosure will only be defined by the appended claims. Like reference numerals refer to like elements throughout the specification.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 1:
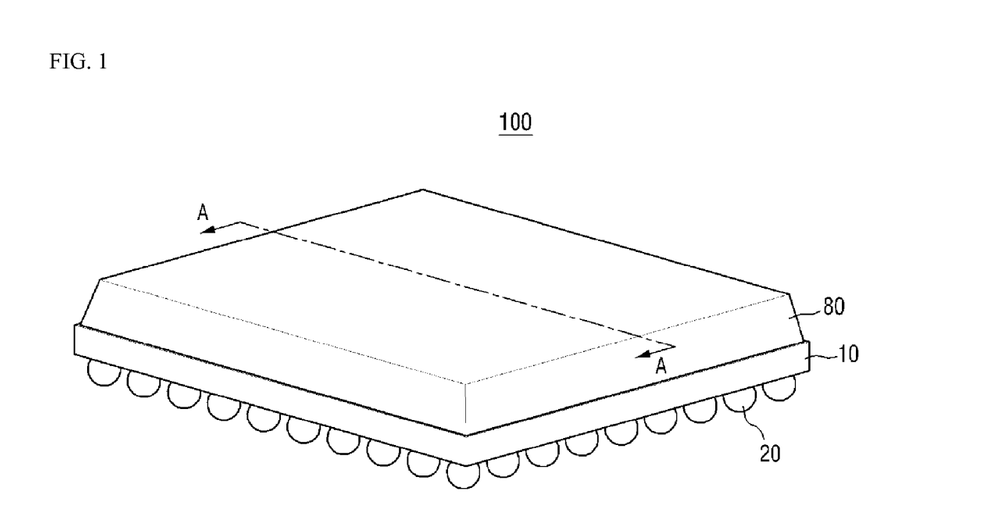
FIG. 1 is a perspective view illustrating a semiconductor package according to an embodiment of the present disclosure.
Figure 2:
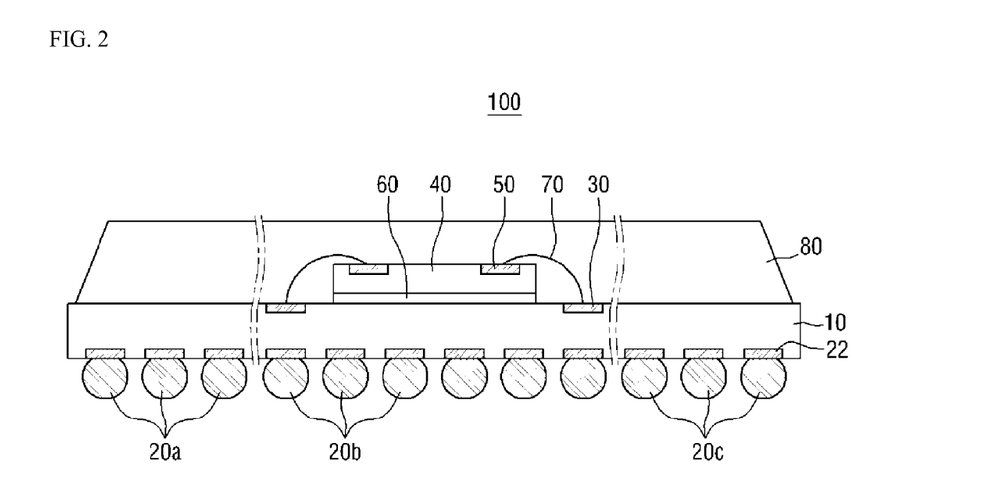
FIG. 2 is a sectional view taken along line A-A of FIG. 1 to illustrate the semiconductor package.

FIG. 1 is a perspective view illustrating a semiconductor package 100 according to an embodiment of the present disclosure. FIG. 2 is a sectional view taken along line A-A of FIG. 1 to illustrate the semiconductor package 100.

Referring to FIGS. 1 and 2, the semiconductor package 100 may include a package substrate 10, an external connection terminal 20, an external pad 22, an internal pad 30, a semiconductor chip 40, a bonding pad 50, a paste part 60, a wire 70 and a molding part 80.

The semiconductor chip 40 may be provided on a package substrate 10. The internal pad 30 may be disposed in an upper portion of the package substrate 10. The external pad 22 may be disposed in a lower portion of the package substrate 10. The external connection terminal 20 may be disposed under a lower surface of the external pad 22.

The package substrate 10 may include a first surface, a second surface opposite to the first surface, and a side surface connecting the first surface to the second surface. The semiconductor chip 40 may be disposed on the first surface of the package substrate 10. The semiconductor chip 40 may be mounted by forming the paste part 60 on an upper surface of a central portion of the package substrate 10 and then by bringing a lower surface of the semiconductor chip 40 into contact with the paste part 60. The paste part 60 may comprise an adhesive film or an adhesive paste. Although the semiconductor package has been illustrated as having the single semiconductor chip 40 in this embodiment, the present disclosure is not limited to this. For instance, the semiconductor package may includes a plurality of semiconductor chips 40 that are stacked on top of another or arranged on the same plane at positions spaced apart from each other.

The package substrate 10 may be a printed circuit board (PCB), a tape substrate, a ceramic substrate or a silicon substrate. In this embodiment, the package substrate 10 is a kind of PCB, but the present disclosure is not limited to this.

Alternatively, the package substrate 10 may be an interposer substrate. In this case, the package substrate 10 may include an insulation body having a rectangular plate shape with a predetermined thickness, metal wiring layers that are formed on both surfaces of the insulation body by a photographic process, and a via that passes through the insulation body and electrically connects the metal wiring layers to each other.

The package substrate 10 may supply power to the semiconductor chip 40, input a signal to the semiconductor chip 40, or receive a signal form the semiconductor chip 40. For this, the package substrate 10 may be electrically connected to the semiconductor chip 40.

The package substrate 10 may include the internal pad 30 and the external pad 22. In this embodiment, the internal pad 30 may comprise a plurality of internal pads that are provided in the upper portion of the package substrate 10 in such a way that an upper surface of each internal pad is exposed to the outside. The external pad 22 may comprise a plurality of external pads that are provided in the lower portion of the package substrate 10 in such a way that a lower surface of each external pad is exposed to the outside. The external pads 22 may be arranged in the lower portion of the package substrate 10 at position spaced apart from each other at regular intervals. The internal pads 30 and the external pads 22 may be electrically connected to each other. The internal pads 30 and the external pads 22 may be made of conductive material, for example, metal.

In this embodiment, external connection terminals 20 may be provided under the lower surfaces of the respective external pads 22. Each external connection terminal 20 may be a solder ball, but the present disclosure is not limited to this. Not all external connection terminals 20 may be electrically connected to the semiconductor chip 40, and some of the external connection terminals 20 may be provided for physical connection to the semiconductor chip 40. However, all of the external connection terminals 20 described in this embodiment are regarded as being provided for electrical connection to the semiconductor chip 40.

Referring to FIG. 2, the external connection terminals 20 are classified into external connection terminals 20a and 20c disposed in a differential signal area, and external connection terminals 20b disposed outside the differential signal area. The term "differential signal area" refers to an area in which the external connection terminals 20a and 20c enabling the semiconductor package 100 to receive or output a high-speed signal are disposed. This will be described later.

The semiconductor chip 40 may include a plurality of bonding pads 50 in the upper portion thereof. Upper surfaces of the bonding pads 50 may be exposed out of the semiconductor chip 40. Each bonding pad 50 may be made of conductive material, e.g. metal such as copper (Cu). Wires 70 may be arranged to electrically connect the bonding pads 50 of the semiconductor chip 40 to the respective internal pads 30 of the package substrate 10.

In the present disclosure, signals of the semiconductor chip 40 can be output from the bonding pads 50 to the external connection terminals 20 via the wires 70, the internal pads 30 and the external pads 22. Through the reverse process, external signals can be input to the semiconductor chip 40. Although the electrical connection between the semiconductor chip 40 and the internal pads 30 has been illustrated as being embodied by the wires 70 in this embodiment, the present disclosure is not limited to this. In other words, any method can be used for the above-mentioned electrical connection so long as the semiconductor chip 40 and the internal pads 30 can be electrically connected to each other.

The molding part 80 may be disposed on the package substrate 10 to covers the semiconductor chip 40. For example, the molding part 80 may be made of an epoxy molding compound (EMC). The molding part 80 may seal the semiconductor chip 40 and the wires 70, thus protecting the semiconductor chip 40 from external physical or electrical shock. Furthermore, the molding part 80 may fix the semiconductor chip 40 and the wires 70 on the package substrate 10.

The semiconductor package according to this embodiment may be a ball grid array (BGA) semiconductor package. Given this, the external pads 22 and the external connection terminals 20 disposed under the respective external pads 22 may be arranged on the second surface of the package substrate 10 in rows and lines to form a regular array. In this embodiment, each external connection terminal 20 may be a solder ball. Hereinafter, the array of the external connection terminals 20 disposed on the package substrate 10 will be explained in more detail with reference to an embodiment of FIG. 3.

Figure 3:
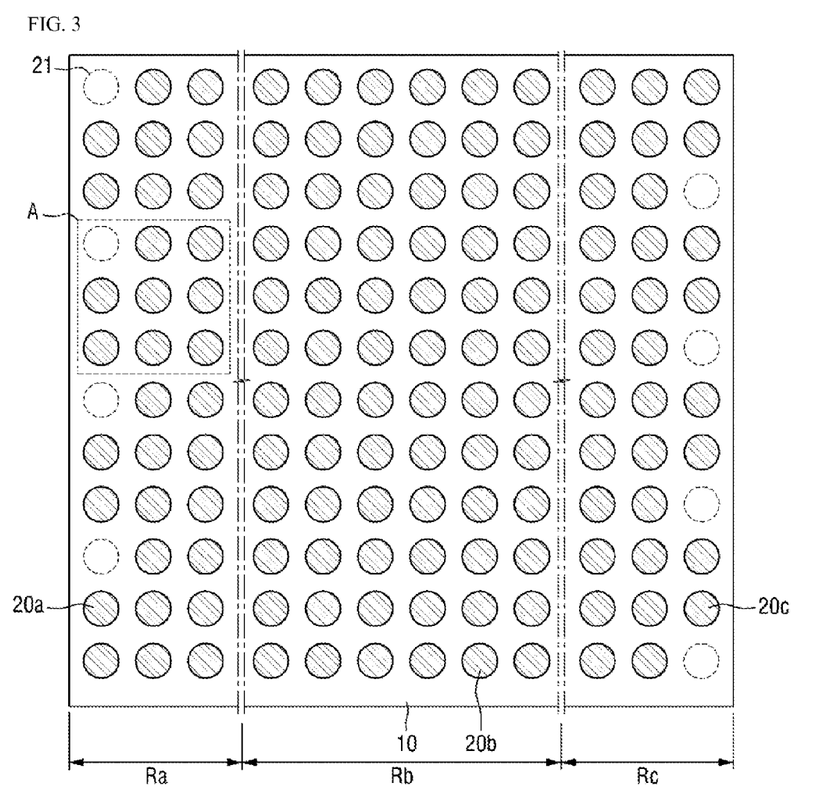
FIG. 3 is a plan view illustrating the package substrate of the semiconductor package according to an embodiment of the present disclosure.

FIG. 3 is a plan view illustrating the package substrate of the semiconductor package according to an embodiment of the present disclosure. Illustrating the array of the external connection terminals 20 of the package substrate 10, FIG. 3 shows a plan view of the turned upside down semiconductor package 100 of the embodiment of FIG. 1.

Referring to FIG. 3, the package substrate 10 may include an A-area Ra, a B-area Rb, and a C-area Rc. Each of the A-area Ra, the B-area Rb, and the C-area Rc may include an array of external connection terminals 20 and external pads 22. The external connection terminals 20 and the external pads 22 may be arranged in a lattice pattern. In this embodiment, each external connection terminal 20 may be limited to being electrically connected by the corresponding external pad 22. Therefore, each external connection terminal 20 will be defined as a notion including the corresponding external pad 22 in the following description.

Meanwhile, each of the A-area Ra and the C-area Rc may include a terminal disposition portion in which the external connection terminal 20 can be disposed, and a non-terminal portion 21 in which no external connection terminal 20 is present.

In this embodiment, although the external connection terminals 20 have been illustrated as being arranged on the second surface of the package substrate 10, the present disclosure is not limited to this. Unlike the embodiment shown in the drawings, the package substrate 10 may be configured such that the non-terminal portion 21 is also formed inside the package substrate 10.

In this embodiment, the A-area Ra and/or the C-area Rc may be an area in which the external connection terminals 20 and the external pads 22 for input or output of a high-speed signal are arranged. In the present disclosure, these areas may refer to terminal disposition areas.

The high-speed signal may be in a differential signal mode. In this embodiment, although three columns of external connection terminals 20 on each of the left and right sides of the package have been shown to be used as the external connection terminals 20 that are provided for input or output of a high-speed signal, the present disclosure is not limited to this. For example, only the left or right three columns of external connection terminals 20 may be used as the external connection terminals 20 provided for input or output of a high-speed signal from or to external devices. Alternatively, upper and/or lower three rows of external connection terminals 20 may be used as the external connection terminals 20 provided for input or output of a high-speed signal from or to the external devices.

Generally, since semiconductor devices are operated at high speed, a differential-mode-signal transmission method may be used for transmission of clock signals or data strobes so that influence of common mode noise can be reduced. The term "differential signal" refers to signals with opposite phases to each other flowing on two signal wires. In other words, differential signaling may use two signal paired wires, and signals with an intentional phase difference of 180° may be respectively sent on the two signal paired wires. That is, the differential signal may have a pair of signals including a positive differential mode signal and a negative differential mode signal with a phase delayed relative to that of the positive differential mode signal, thus forming a single differential pair.

To precisely transmit signals in the differential signal mode, two signal wires forming a single differential pair must be arranged adjacent and parallel to each other. Thereby, not only a time error between the positive differential mode signal and the negative differential mode signal but also noise can be reduced. A pair of external connection terminals 20, into which a differential signal is input, may receive external signals through a pair of adjacent signal wires, whereby a differential pair can be defined as being formed in the differential signal mode.

In the array of the external connection terminals 20 formed on the package substrate 10 of the semiconductor package 100 according to this embodiment, outer three columns of external connection terminals 20 may be used to form a differential pair. As illustrated in the embodiment of FIG. 3, each of the A-area Ra and the C-area Rc may include differential signal areas.

Referring to FIG. 3 again, an area designated by a dotted line refers to a single differential signal area A. That is, the A-area Ra may include four differential signal areas A. The C-area Rc may also include four differential signal areas A.

This will be explained in detail below. In the differential signal area A designated by the dotted line, the external connection terminals 20a and the terminal disposition portions, on which the external connection terminals 20a are disposed, may form a 3×3 array. With regard to the differential signal area A, two external connection terminals 20a of the uppermost row, three external connection terminals 20a of the row below the uppermost row, and three external connection terminals 20a of the row located therebelow, that is, eight external connection terminals 20a, may form the single differential signal area A. As shown in the drawing, the differential signal area A may also include a single non-terminal portion 21 in an outer upper portion thereof.

In more detail, the differential signal area A may have an external connection terminal group including first through eight external connection terminals 20a. The first external connection terminal and the second external connection terminal may be successively arranged in the upper row from the left to the right. The third external connection terminal, the fourth external connection terminal and the fifth external connection terminal may be successively arranged in the middle row from the left to the right. The sixth external connection terminal, the seventh external connection terminal and the eighth external connection terminal may be successively arranged in the lower row from the left to the right. In other words, in the differential signal area A, the third and sixth external connection terminals may be successively arranged in the left column from the top to the bottom. The first, fourth, and seventh external connection terminals may be successively arranged in the middle column from the top to the bottom. The second, fifth, and eighth external connection terminals may be successively arranged in the right column from the top to the bottom. Furthermore, as shown in the drawing, the single non-terminal portion 21 may be formed on the outer upper portion of the differential signal area A.

In this embodiment, each differential signal area may include a single non-terminal portion 21, that is, a portion from which one of external connection terminals 20 arranged on the outermost column has been removed, so that the non-terminal portions 21 of the differential signal areas can be arranged at periodic positions spaced apart from each other at regular intervals. Signal wires for use in inputting external signals to the external connection terminals 20 may pass through the non-terminal portion 21. In this way, in the semiconductor package according to this embodiment, signal wires for input or output of differential signals can be easily connected even to the rightmost column of the differential signal area A. Therefore, the degree of freedom in design of arrangement of signal wires of a semiconductor package module can be enhanced, whereby the efficiency of manufacturing the semiconductor package module can be improved. Hereinafter, the semiconductor package module including the semiconductor package according to this embodiment will be described in more detail.

Figure 4:
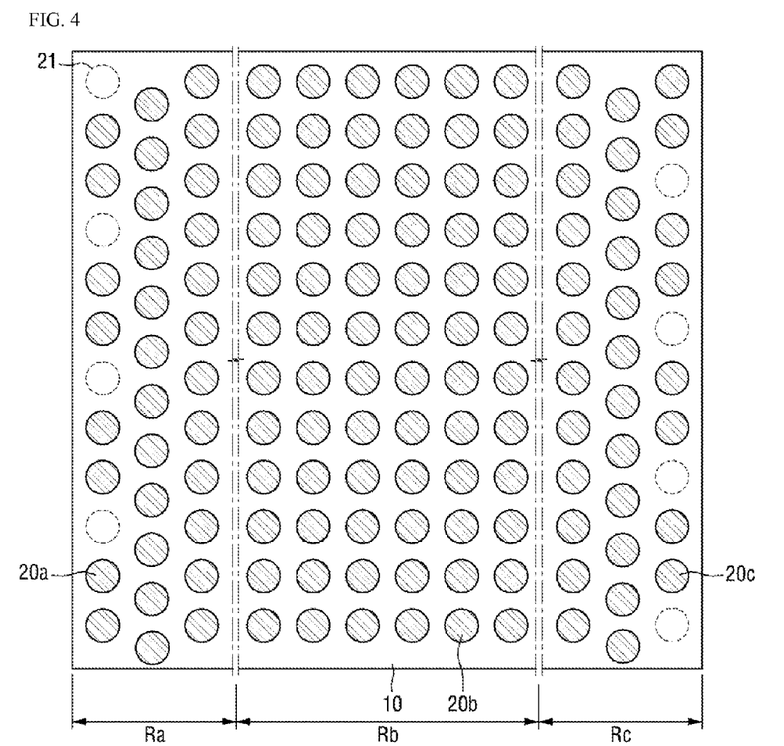
FIG. 4 is a plan view illustrating a package substrate of a semiconductor package according to another embodiment of the present disclosure.

FIG. 4 is a plan view illustrating a package substrate of a semiconductor package according to another embodiment of the present disclosure. The general construction of the package substrate according to this embodiment, other than an array form of external connection terminals 20, is the same as that of the package substrate according to the embodiment of FIG. 3. Therefore, further explanation thereof is deemed unnecessary.

The external connection terminals 20*a* or 20*c* formed in the A-area Ra or the C-area Rc of the package substrate according to the embodiment of FIG. 3 may form a lattice array. Unlike this, external connection terminals 20*a* or 20*c* formed in the differential signal area of the package substrate according to the embodiment of FIG. 4 may form a zigzag array.

Figure 5:
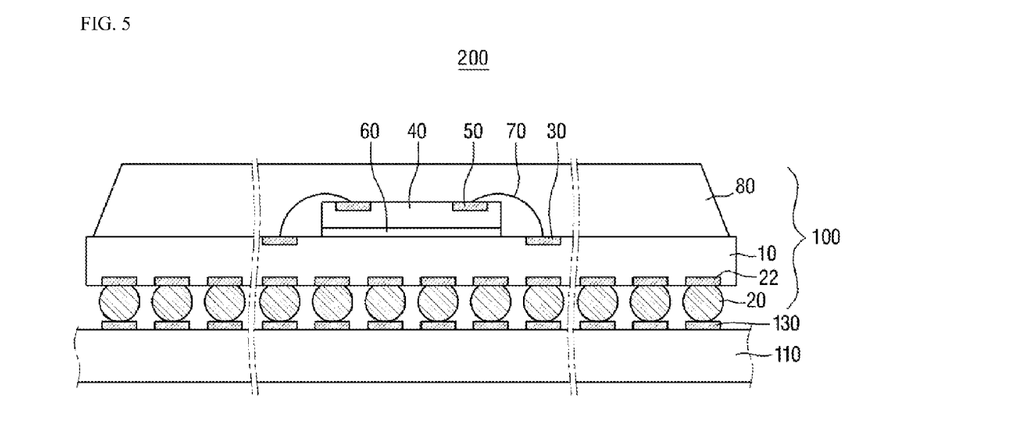
FIG. 5 is a sectional view illustrating a semiconductor package module according to an embodiment of the present disclosure.
Figure 6:
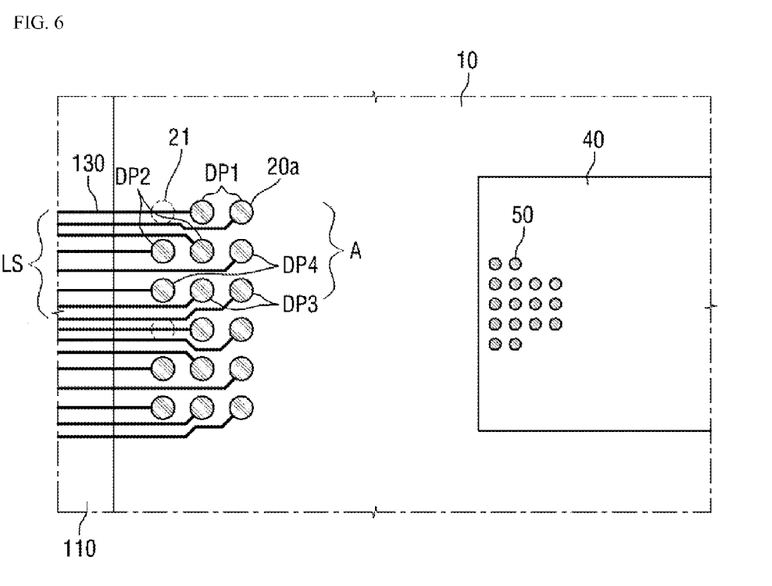
FIG. 6 is a schematic view illustrating connection relationship between a module substrate of the semiconductor package module and external connection terminals of the semiconductor package in the semiconductor package module.

FIG. 5 is a sectional view illustrating a semiconductor package module according to an embodiment of the present disclosure. FIG. 6 is a schematic view illustrating connection relationship between a module substrate of the semiconductor package module and external connection terminals of the semiconductor package in the semiconductor package module. The semiconductor package module according to the embodiment of FIGS. 5 and 6 may include the semiconductor package 100 according to the embodiment of FIGS. 1 through 3. Therefore, explanation of some elements will be omitted if deemed redundant.

Referring to FIGS. 5 and 6, the semiconductor package module 200 may include a substrate 110, signal wires 130 and the semiconductor package 100. The signal wires 130 may form a signal wire group LS. The substrate 110 and the signal wires 130 may form a module substrate. The signal wires 130 may be arranged on the substrate 110, and each signal wire 130 may be made of conductive material, e.g., metal. The signal wires 130 may be formed in a predetermined wiring pattern and electrically connected to the semiconductor chip 40 by the external connection terminals 20, the external pads 22, and the internal pads 30. Thus, external signals can be input to the semiconductor chip 40 through the signal wires 130, or signals can be output from the semiconductor chip 40 to external devices through the signal wires 130. In this embodiment, the signals may include differential signals.

Referring to FIG. 6 again, each differential signal area A may include eight external connection terminals 20*a* disposed in the respective terminal disposition portions, and one non-terminal portion 21.

In the differential signal area A, the external connection terminals 20*a* may include a first external connection terminal pair Dp1, a second external connection terminal pair Dp2, a third external connection terminal pair Dp3 and a fourth external connection terminal pair Dp4. All of the first through fourth external connection terminal pairs Dp1, Dp2, Dp3, and Dp4 may be differential pairs of the differential signal mode described above. The signal wires 130 respectively connected to the first through fourth external connection terminal pairs Dp1, Dp2, Dp3, and Dp4 may be disposed adjacent and parallel to each other.

As described above, in this embodiment, the differential signal area A may include at the outermost side thereof a non-terminal portion 21 in which no external connection terminal 20*a* is present. Because the signal wires 130 can pass through the non-terminal portion 21, differential signals can also be easily input to or output from the external connection terminals 20*a* that are disposed at the innermost side of the differential signal area A. Therefore, in the semiconductor package module 200 according to the present disclosure, the signal wires 130 of the substrate 110 can be easily connected even to the external connection terminals 20 disposed at the inner side of the package substrate 10 without a fine signal wire or fine wiring pattern formed on the substrate 110 of the module substrate through a separate fine process.

Figure 7:
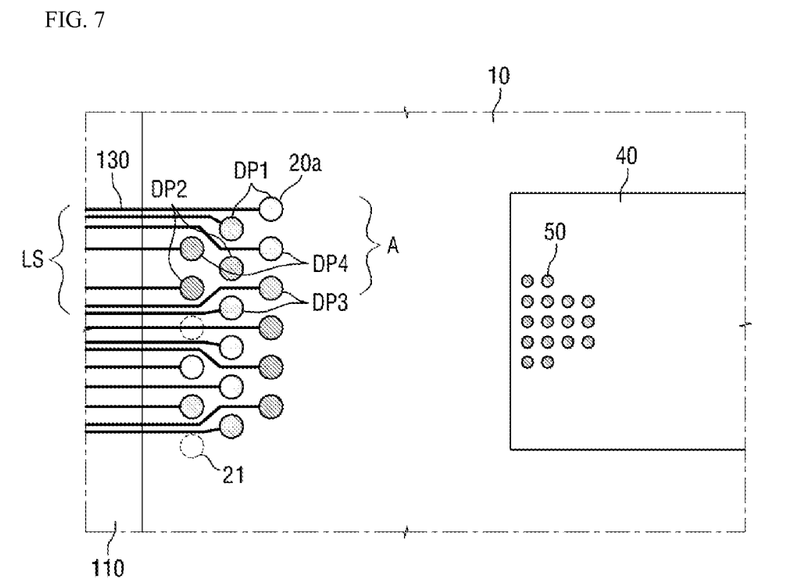
FIG. 7 is a schematic view illustrating a semiconductor package module another embodiment of the present disclosure.

FIG. 7 is a schematic view illustrating a semiconductor package module another embodiment of the present disclosure. A semiconductor package of the semiconductor package module according to this embodiment may be the semiconductor package according to the embodiment of FIG. 4. That is, the external connection terminals 20*a* disposed in each differential signal area may be arranged in a zigzag manner. The connection relationship between the semiconductor package and the module substrate according to the embodiment of FIG. 7 other than the array structure of the external connection terminals 20*a* is the same as that of the embodiment of FIG. 6. Therefore, detailed explanation of the same elements will be omitted if deemed redundant.

Figure 8:
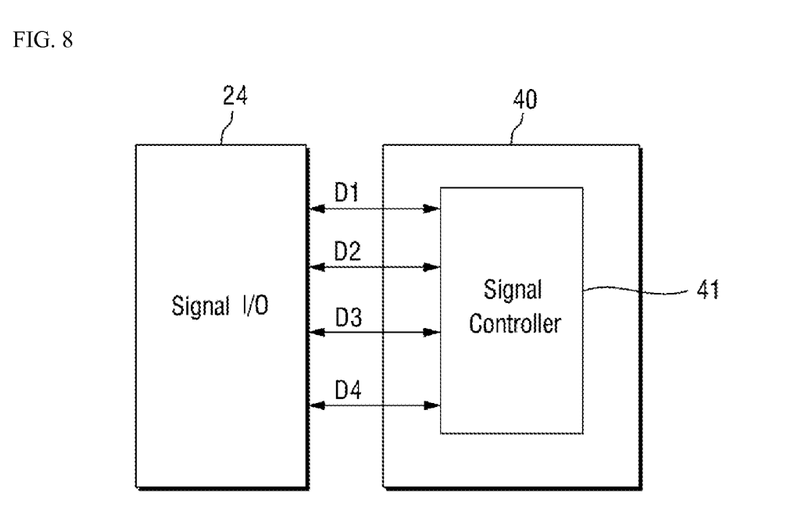
FIG. 8 is a block diagram illustrating a high-speed signal processing process of the semiconductor package and the semiconductor package module according to an embodiment of the present disclosure.

FIG. 8 is a block diagram illustrating a high-speed signal processing process of the semiconductor package and the semiconductor package module according to an embodiment of the present disclosure.

Referring to FIGS. 6 and 8, a signal input and output unit 24 may include a differential signal area A. The differential signal area A may include external connection terminals 20*a* respectively connected to signal wires 130. The semiconductor chip 40 may include a signal controller 41. The signal controller 41 may be a calculation unit and may be configured to control or process a differential signal.

A first differential signal D1 may be a signal input through the first external connection terminal pair Dp1. A second differential signal D2 may be a signal input through the second external connection terminal pair Dp2. A third differential signal D3 may be a signal input through the third external connection terminal pair Dp3. A fourth differential signal D4 may be a signal input through the fourth external connection terminal pair Dp4. The first through fourth differential signals D1, D2, D3, and D4 input to the semiconductor chip 40 can be controlled or processed by the signal controller 41.

Figure 9A:
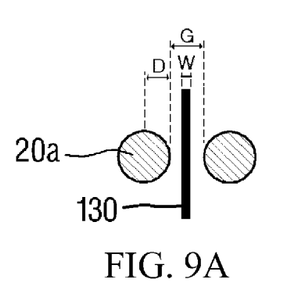
FIGS. 9A and 9B are schematic views illustrating arrangement intervals between the external connection terminals and the signal wires according to the present disclosure.
Figure 9B:
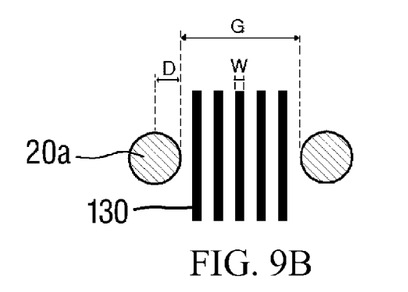

FIGS. 9A and 9B are schematic views illustrating arrangement intervals between the external connection terminals and the signal wires according to the present disclosure. FIG. 9A illustrates the arrangement intervals pertaining to the middle column in the embodiment of FIG. 6 or 7. FIG. 9B illustrates the arrangement intervals pertaining to the left column.

In detail, FIG. 9A shows a case that a single signal wire 130 is disposed between two external connection terminals 20*a*. FIG. 9B shows a case that five signal wires 130 are disposed between two external connection terminals 20*a*. Reference character D denotes a radius of the external connection terminal 20*a*. Reference character W denotes a maximum line width. Reference character G denotes a distance between the two external connection terminal 20*a*.

Referring to FIG. 9A, the radius D may be about 250 μm, the maximum line width may be about 100 μm, and the distance G may be 300 μm. Referring to FIG. 9B, the radius D may be about 250 μm, the maximum line width may be about 100 µm, and the distance G may be about 1100 µm. Therefore, in case of FIG. 9B, the five signal wires 130 disposed between the external connection terminals 20a can be arranged such that each signal wire 130 may be spaced apart from the adjacent signal wire 130 or the external connection terminal 20a by a distance of at least 100 µm.

Figure 10:
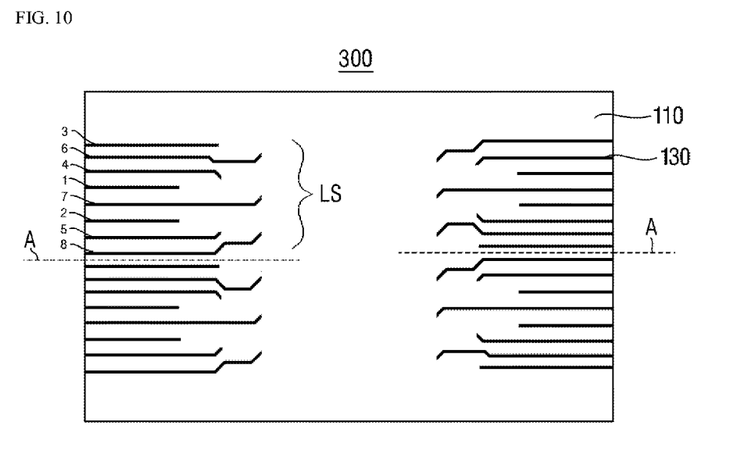
FIG. 10 is a plan view illustrating a module substrate according to an embodiment of the present disclosure.

FIG. 10 is a plan view illustrating a module substrate 300 according to an embodiment of the present disclosure. The module substrate 300 may include a substrate 110 and signal wires 130.

Referring to FIG. 10, two signal wire groups LS may be formed on opposite sides of a dotted line A serving as a boundary therebetween. Each signal wire group LS may include a first signal wire 1, a second signal wire 2, a third signal wire 3, a fourth signal wire 4, a fifth signal wire 5, a sixth signal wire 6, a seventh signal wire 7, and an eighth signal wire 8. As shown in the drawing, the first through eighth signal wires 1, 2, 3, 4, 5, 6, 7, and 8 may extend inward from an edge of the substrate 110. The first and second signal wires 1 and 2 may extend to a first area on the substrate 110. The third through fifth signal wires 3, 4, and 5 may extend to a second area on the substrate 110. The sixth through eighth signal wires 6, 7, and 8 may extend to a third area on the substrate 110. Among inner ends of the first through eighth signal wires 1 through 8, the distance between the edge of the substrate 110 and the inner ends of the first and second signal wires 1 and 2 may be shortest. The inner ends of the sixth through eighth signal wires 6, 7, and 8 may be disposed at the innermost positions on the substrate 110. The inner ends of the third through fifth signal wires 3, 4, and 5 may be disposed between the inner ends of the first and second signal wires 1 and 2 and the inner ends of the sixth through eighth signal wires 6, 7, and 8.

In this embodiment, the module substrate may include the eight signal wires 130 extending to the three corresponding areas separated from each other. Therefore, the module substrate can be electrically connected to the external connection terminals arranged in a 3×3 array.

Figure 11:
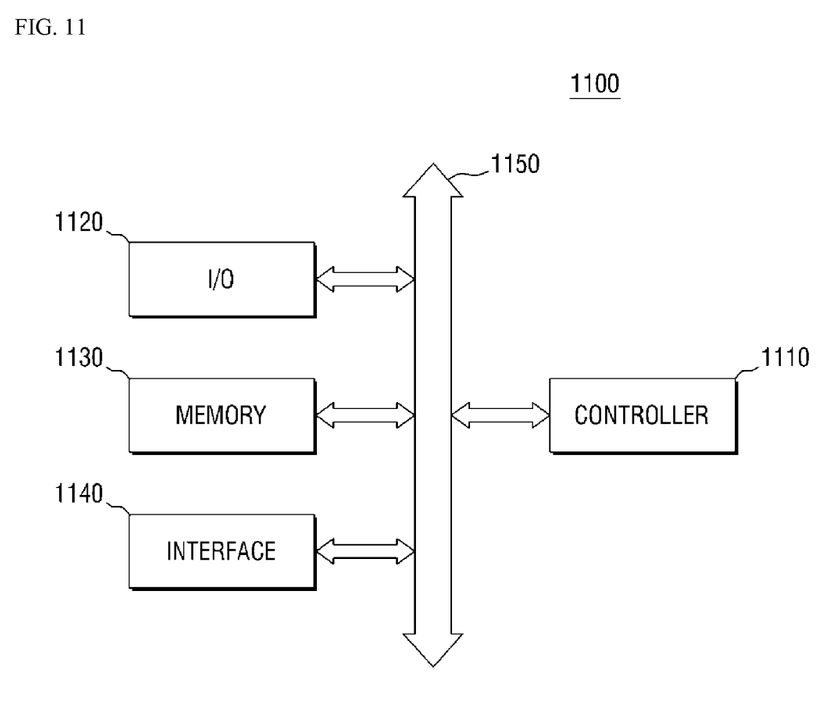
FIG. 11 is a block diagram of an electronic system including the semiconductor package or the semiconductor package module according to an embodiment of the present disclosure.

FIG. 11 is a block diagram of an electronic system 1100 including the semiconductor package or the semiconductor package module according to an embodiment of the present disclosure.

Referring to FIG. 11, the electronic system 1100 according to this embodiment of the present disclosure may include a controller 1110, an input and output device (I/O) 1120, a memory device 1130, an interface 1140, and a bus 1150. The controller 1110, the input and output device 1120, the memory device 1130 and/or the interface 1140 can be connected to each other by the bus 1150. The bus 1150 may function as a path for data transfer.

The controller 1110 may include at least one among a microprocessor, a digital signal processor, a microcontroller, and a logic element having a similar function to that of the above-mentioned elements. The input and output device 1120 may include a keypad, a keyboard, a display, etc. The memory device 1130 can store data and/or commands or the like. The interface 1140 may function to transmit data to a communication network or receive data from the communication network. The interface 1140 may be embodied in a wired or wireless manner. For instance, the interface 1140 may include an antenna, a wired and wireless transceiver or the like.

Although it is not shown in the drawings, the electronic system 1100 may further include a high-speed DRAM (dynamic random access memory) and/or SRAM (static random access memory) or the like as an operation memory for improving the operation of the controller 1110. The semiconductor package or the semiconductor package module according to any one of the above-described embodiments of the present disclosure may be used as the operation memory. Furthermore, the semiconductor package or the semiconductor package module according to any one of the above-described embodiments may be provided in the memory device 1130 or as a part of the controller 1110, the input and output device (I/O) 1120 or the like.

The electronic system 1100 may be applied to a personal digital assistant (PDA), a portable computer, a web tablet, a wireless phone, a mobile phone, a digital music player, a memory card, or any of other electronic devices capable of transmitting and/or receiving data in wireless environment.

Figure 12:
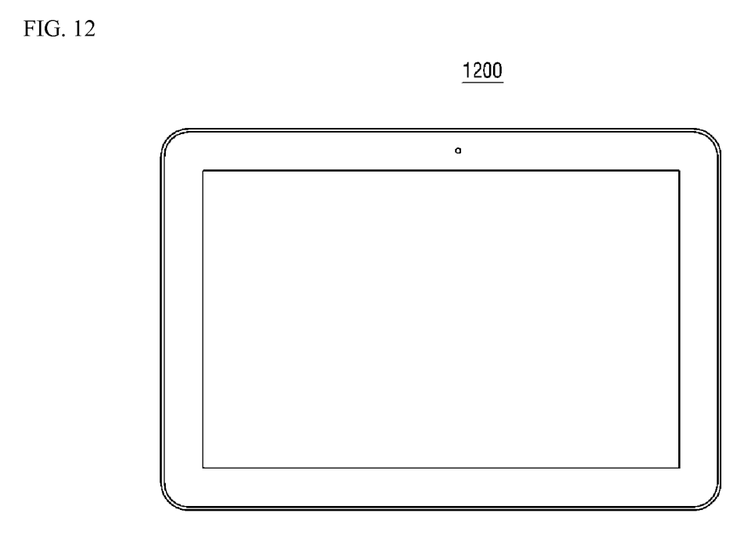
FIGS. 12 through 14 illustrate examples of a semiconductor system to which the semiconductor package or the semiconductor package module according to any one of the embodiments of the present disclosure can be applied.
Figure 13:
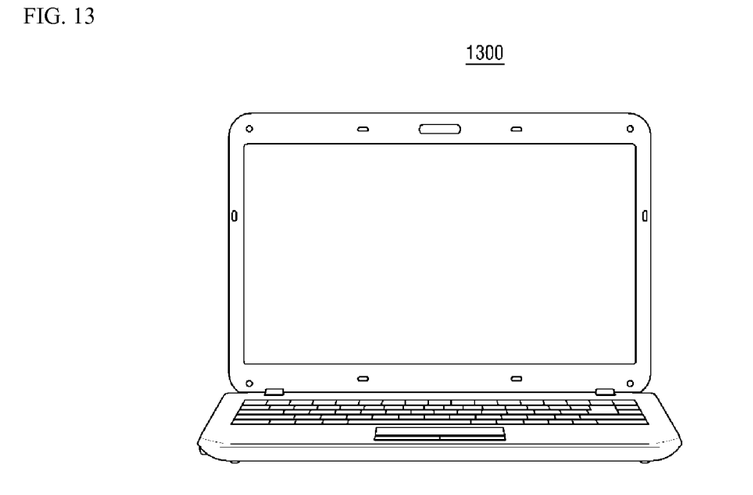
Figure 14:
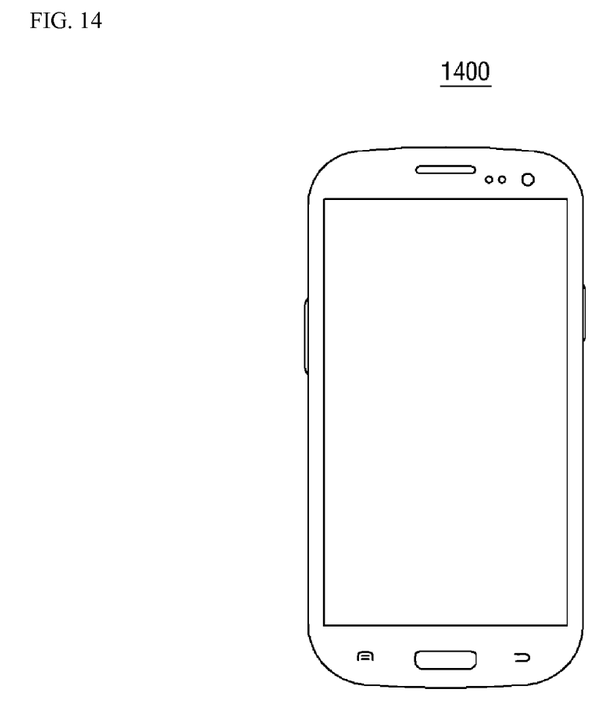

FIGS. 12 through 14 illustrate examples of a semiconductor system to which the semiconductor package or the semiconductor package module according to any one of the embodiments of the present disclosure can be applied.

FIG. 12 is a view showing a tablet PC 1200, FIG. 13 is a view showing a notebook computer 1300, and FIG. 14 shows a smartphone 1400. Either the semiconductor package or the semiconductor package module according to any one of the embodiments of the present disclosure can be used in the tablet PC 1200, the notebook computer 1300 or the smartphone 1400.

Moreover, those skilled in this art will be able to easily understand that the semiconductor package or the semiconductor package module according to the embodiments of the present disclosure can be used in other integrated circuit devices which are not described above. That is, although only the table PC 1200, the notebook computer 1300, and the smartphone 1400 have been given as examples of the semiconductor system according to an embodiment of the present disclosure, the examples of the semiconductor system according to the present disclosure is not limited to these. For example, each of the semiconductor systems according to the embodiments of the present disclosure may be used to embody a computer, an ultra mobile PC (UMPC), a workstation, a notebook, a personal digital assistant (PDA), a portable computer, a wireless phone, a mobile phone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, etc.

Although some example embodiments of the present disclosure have been disclosed for illustrative purposes, those skilled in the art will appreciate that various modifications, additions and substitutions are possible, without departing from the scope and spirit of the present disclosure as disclosed in the accompanying claims.

What is claimed is:

1. A semiconductor package module, comprising:
a module substrate provided with a plurality of signal wires on an upper surface thereof;
a package substrate disposed on the module substrate, the package substrate including a first surface, and a second surface opposite to the first surface;
a semiconductor chip disposed on the first surface of the package substrate; and
a plurality of external connection terminals disposed on the second surface of the package substrate, the external connection terminals being electrically connected to the semiconductor chip by metal wiring layers through the package substrate, wherein the second surface of the package substrate includes a plurality of terminal disposition portions and a plurality of non-terminal portions, each of the plurality of external connection terminals is disposed in a corresponding terminal disposition portion among the plurality of terminal disposition portions and connected to a corresponding signal wire among the plurality of signal wires, the plurality of non-terminal portions are disposed adjacent to an edge of the package substrate, and are disposed spaced apart from each other at equal intervals, at least two among the plurality of terminal disposition portions are disposed between the non-terminal portions, and at least two of the plurality of signal wires pass under a corresponding one of the plurality of non-terminal portions, wherein the plurality of terminal disposition portions and the plurality of non-terminal portions form an array, the plurality of external connection terminals are disposed in an area defined by three columns of the array that are located adjacent to the edge of the package substrate, and the area defined by the three columns of the array that are located adjacent to the edge of the package substrate includes a plurality of differential signal areas, and each of the plurality of differential signal areas includes eight among the plurality of terminal disposition portions and one among the plurality of non-terminal portions.

2. The semiconductor package module according to claim 1, wherein each of the plurality of differential signal areas has a 3×3 array.

3. The semiconductor package module according to claim 1, wherein, among the plurality of external connection terminals, the external connection terminals disposed in the eight terminal disposition portions form four differential pairs.

4. The semiconductor package module according to claim 3, wherein at least one pair of the four differential pairs comprise, among the plurality of external connection terminals, external connection terminals spaced apart from each other.

5. The semiconductor package module according to claim 1, wherein the three columns of the array that are located adjacent to the edge of the package substrate have a lattice array structure.

6. The semiconductor package module according to claim 1, wherein the three columns of the array that are located adjacent to the edge of the package substrate have a zigzag array structure.

7. The semiconductor package module according to claim 1, wherein each of the plurality of external connection terminals comprises a solder ball.

8. The semiconductor package module according to claim 1, wherein at least one of the module substrate and the package substrate comprises a printed circuit board.

* * * * *